United States Patent
Fugate et al.

(10) Patent No.: US 9,046,556 B2
(45) Date of Patent: Jun. 2, 2015

(54) SENSING DEVICE AND RELATED OPERATING METHODS

(75) Inventors: Kevin R. Fugate, Madison, MS (US); Edward W. Carstens, Madison, MS (US); Paige M. Holm, Phoenix, AZ (US); Dean W. Miller, Madison, MS (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 485 days.

(21) Appl. No.: 13/523,675

(22) Filed: Jun. 14, 2012

(65) Prior Publication Data
US 2013/0335065 A1 Dec. 19, 2013

(51) Int. Cl.
G01R 35/00 (2006.01)
G01R 33/00 (2006.01)
G01R 33/09 (2006.01)

(52) U.S. Cl.
CPC ........ G01R 33/0035 (2013.01); G01R 33/0047 (2013.01); G01R 33/0082 (2013.01); G01R 33/098 (2013.01)

(58) Field of Classification Search
USPC ......... 324/202, 685, 721, 750.03; 702/85, 99, 702/104; 73/497
See application file for complete search history.

(56) References Cited

U.S. PATENT DOCUMENTS

| | | | |
|---|---|---|---|
| 6,046,433 A | 4/2000 | Gross et al. | |
| 6,484,117 B1 | 11/2002 | Wohlfarth | |
| 7,268,545 B2 | 9/2007 | Sato | |
| 8,030,952 B2 | 10/2011 | Kinsley | |
| 2004/0104724 A1 | 6/2004 | Sato | |
| 2007/0076330 A1 | 4/2007 | Chung et al. | |
| 2009/0146746 A1* | 6/2009 | Unkrich et al. | 331/70 |
| 2011/0132096 A1 | 6/2011 | Ricks | |
| 2012/0215477 A1* | 8/2012 | Tuck et al. | 702/99 |

FOREIGN PATENT DOCUMENTS

WO 2009060651 A1 5/2009

OTHER PUBLICATIONS

Chen, et al., Design of Temperature Compensation System of Pressure Sensors, Proceedings of the 2006 IEEE International Conference on Information Acquisition, Aug. 20-23, 2006, Weihai, Shandong, China.*

* cited by examiner

Primary Examiner — Melissa Koval
Assistant Examiner — Daniel Miller
(74) Attorney, Agent, or Firm — Ingrassia Fisher & Lorenz, P.C.

(57) ABSTRACT

Apparatus, systems, and methods are provided for sensing devices. An exemplary sensing device includes a sensing arrangement on a substrate to sense a first property, a heating arrangement, and a control system coupled to the first sensing arrangement and the heating arrangement to activate the heating arrangement to heat the first sensing arrangement and deactivate the heating arrangement while obtaining one or more measurement values for the first property from the first sensing arrangement.

19 Claims, 5 Drawing Sheets

SENSING DEVICE AND RELATED OPERATING METHODS

TECHNICAL FIELD

Embodiments of the subject matter described herein relate generally to sensing devices and applications, and more particularly, embodiments of the subject matter relate to compensating for performance variations of sensing arrangements with respect to temperature.

BACKGROUND

Sensors are used in a variety of applications. For example, an electronic device may include a sensor that is fabricated on a semiconductor die and generates electrical signals indicative of the magnitude of the sensed property that is exerted on or is otherwise proximate to the semiconductor die. In practice, however, temperature fluctuations can influence electrical characteristics of the components of the sensor, and thereby undesirably influence the measurement of the sensed property. Accordingly, sensing devices are typically calibrated for their susceptibility to temperature fluctuations at final test. However, the electrical characteristics of the components of the sensor may also be influenced by stresses introduced when a sensing device is soldered or otherwise mounted to an electronics substrate or other external circuitry, thereby reducing the effectiveness of the calibration performed at final test.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, which are not necessarily drawn to scale.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Embodiments of the subject matter described herein relate to sensing devices that include a heating arrangement provided on a semiconductor substrate (or die) which may be activated to heat a sensing arrangement and calibrate that sensing arrangement for its susceptibility to temperature fluctuations after the sensing device has been affixed, bonded, soldered, or otherwise mounted to an electronics substrate. As described in greater detail below, in exemplary embodiments, the sensing device includes a control system that activates or otherwise enables the heating arrangement in response to receiving signals from an external computing device, and the control system automatically deactivates the heating arrangement whenever measurements from the sensing arrangement are subsequently obtained. Additionally, the sensing device includes a temperature sensing arrangement used to obtain temperature measurements concurrent to the measurements obtained from the sensing arrangement being calibrated. As described in greater detail below, measurements of the sensed property and the corresponding temperature measurements are utilized to determine temperature coefficients for the sensing arrangement after the sensing device is mounted to the electronics substrate. In exemplary embodiments, the sensing device includes one or more storage elements configured to maintain a trim code determined based on the temperature coefficient information, wherein the control system utilizes the trim code and subsequent temperature measurements from the temperature sensing arrangement to determine temperature compensation values utilized to adjust subsequent measurements of the sensed property to obtain a temperature compensated (or calibrated) measurement of the sensed property. In accordance with one or more embodiments, the sensing arrangement is realized as a magnetic sensing arrangement fabricated or otherwise provided on a separate die that is different from the die having the heating arrangement and control system provided thereon, wherein the control system utilizes the trim code and subsequent temperature measurements to determine temperature compensation values utilized to determine temperature compensated measurements of the ambient magnetic field.

Figure 1:
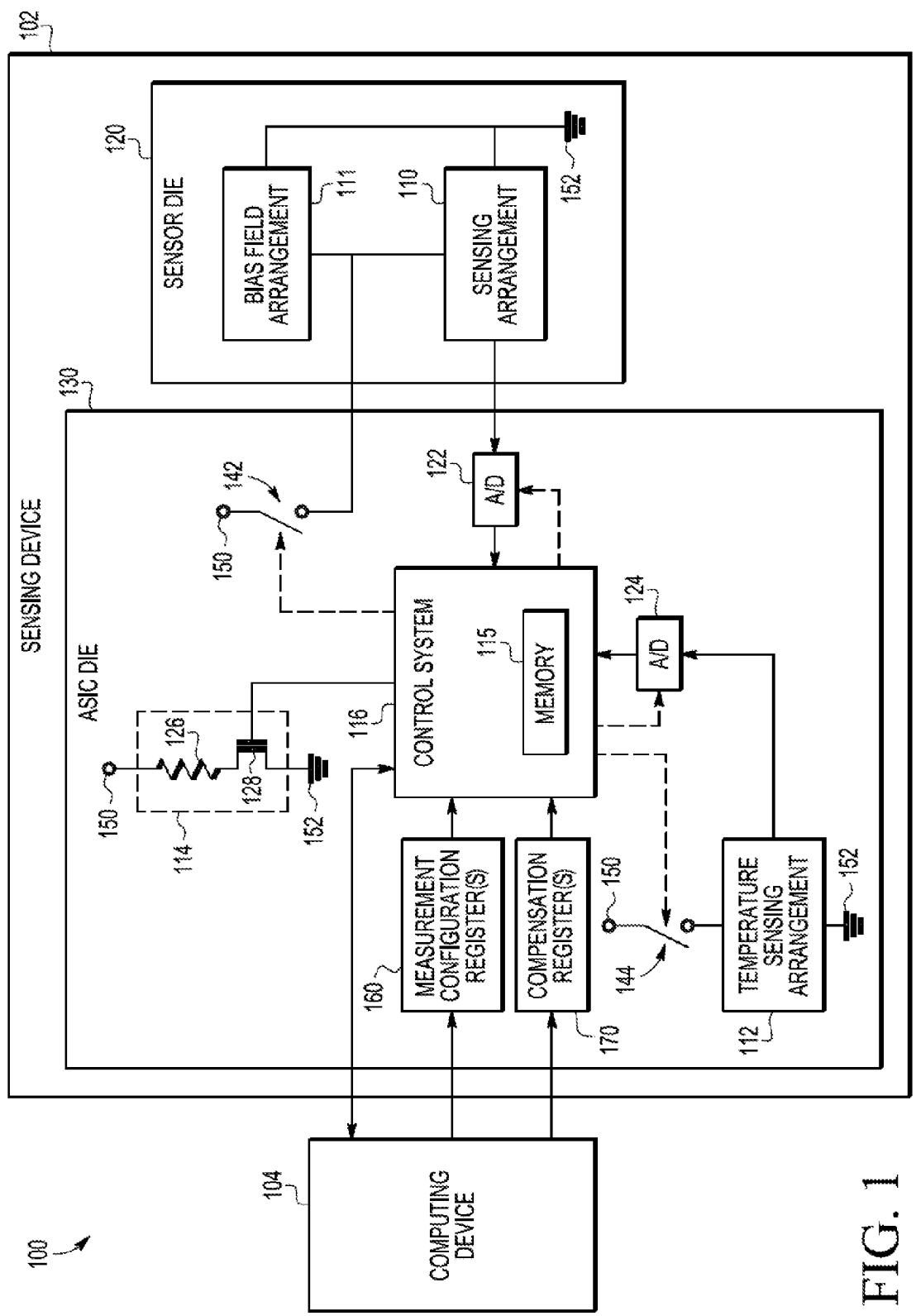
FIG. 1 is a block diagram of an exemplary sensing system in accordance with one embodiment of the invention.

FIG. 1 depicts an exemplary embodiment of a sensing system 100 that includes a sensing device 102 and a computing device 104. As described in greater detail below, in exemplary embodiments, the sensing device 102 calculates temperature compensated measurement values for a physical property (e.g., a magnetic field, a pressure, an acceleration, or the like) that is sensed or otherwise measured by a sensing arrangement 110 and outputs the temperature compensated measurement values to the computing device 104. As used herein, a temperature compensated (or calibrated) measurement value for a physical property should be understood as referring to a measurement value for that physical property that is influenced, adjusted, or otherwise modified by a sensed (or measured) value for the temperature corresponding to that measurement value. In this regard, the temperature compensated measurement value accounts for the variations to performance characteristics of the sensing arrangement 110 in response to temperature fluctuations that are not intended to be measured by that sensing arrangement 110. It should be understood that FIG. 1 is a simplified representation of the sensing system 100 for purposes of explanation and is not intended to limit the subject matter described herein.

In exemplary embodiments, the sensing device 102 includes, without limitation, the sensing arrangement 110 configured to sense or otherwise measure a physical property, a temperature sensing arrangement 112, one or more heating arrangements 114, and a control system 116. As described in greater detail below, in exemplary embodiments, the control system 116 operates the heating arrangement 114 as part of a calibration process for determining temperature coefficient information (e.g., scalar values, equations, functions, or the like) for the sensing arrangement 110 and calculating a trim code, which is stored or otherwise maintained by one or more data storage elements 170. The control system 116 subsequently calculates temperature compensated measurement values by adjusting measurement values obtained from the sensing arrangement 110 (which are uncompensated with respect to temperature) using the trim code and the temperature concurrently measured by the temperature sensing arrangement 112. For convenience, the temperature uncompensated measurement values obtained from the sensing arrangement 110 may alternatively be referred to herein as "raw" measurement values, although in some cases the temperature uncompensated measurement values may already be compensated for one or more other performance characteristics of the sensing arrangement 110 (e.g., offset and/or sensitivity) prior to being output to the control system 116. In accordance with one embodiment, the control system 116 utilizes the trim code and the current temperature to calculate a temperature compensation value that is added to and/or subtracted from the raw measurement value obtained from the sensing arrangement 110 to adjust the raw measurement value and obtain the temperature compensated measurement value. As described in greater detail below, the control system 116 automatically deactivates the heating arrangement 114 while raw measurements are obtained from the sensing arrangement 110 and obtains temperature measurements from the temperature sensing arrangement 112 concurrently to obtaining raw measurements from the sensing arrangement 110.

In an exemplary embodiment, the sensing arrangement 110 is realized as magnetic sensing arrangement (or magnetometer), such as a magnetic tunnel junction (MTJ) sensor formed, fabricated, or otherwise provided on a first semiconductor substrate 120 (or die). However, it should be noted that the sensing arrangement 110 is not intended to be limited to magnetic sensing arrangements, and in alternative embodiments, the sensing arrangement 110 may be realized as a pressure sensor, an accelerometer, a gyroscope, an inertial sensor, or the like. That said, exemplary embodiments described herein utilize a magnetic sensing arrangement, and accordingly, for convenience, but without limitation, the sensing arrangement 110 may be referred to herein as a magnetic sensing arrangement and the die 120 may be referred to herein as a magnetic sensor die. In exemplary embodiments, the magnetic sensing arrangement 110 includes a negative reference (or ground) voltage node (or input) that is coupled to a node 152 configured to receive a negative (or ground) reference voltage for the sensing device 102 and positive reference (or supply) voltage node (or input) that is coupled to a node 150 configured to receive a positive reference (or supply) voltage for the sensing device 102 via a switching element 142. In this regard, the supply voltage node 150 may be electrically connected to a supply voltage input terminal (or pin or pad) of the sensing device 102 and the ground voltage node 152 may be electrically connected to a ground voltage input terminal (or pin or pad) of the sensing device 102. As illustrated in FIG. 1, the magnetic sensor die 120 also includes a bias field arrangement 111 configured to provide a fixed magnetic field to bias the magnetic sensing arrangement 110 when the magnetic sensing arrangement 110 is activated, turned on, or otherwise operated by activating switching element 142, as described in greater detail below. As described above, in accordance with one or more embodiments, the magnetic sensing arrangement 110 is calibrated for one or more performance characteristics, such as, for example, offset, sensitivity, cross-axis sensitivity, or the like, such that the output from the sensor die 120 that is sampled or otherwise obtained by the control system 116 is calibrated (or compensated) for those performance characteristics. For example, the magnetic sensing arrangement 110 may also include calibration circuitry or other components configured to support providing a calibrated output indicative of the ambient magnetic field. In this regard, the magnetic sensing arrangement 110 may be understood as a calibrated magnetic sensing arrangement 110 in that it provides an output that has been calibrated for its inherent performance characteristics (e.g., prior to the magnetic sensing arrangement 110 being incorporated in the sensing device 102).

In the illustrated embodiment, the sensing device 102 also includes a second semiconductor substrate 130 (or die) having the temperature sensing arrangement 112, the heating arrangement 114, and the control system 116 formed, fabricated, or otherwise provided thereon. For convenience, but without limitation, the second semiconductor substrate 130 may alternatively be referred to herein as the application-specific integrated circuit (ASIC) die by virtue of the second semiconductor substrate 130 having the control system 116 formed thereon. It should be noted that in practice, the ASIC die 130 may include additional circuitry, components, and the like configured to perform additional functions and/or processes that are not described herein. Furthermore, while FIG. 1 illustrates the temperature sensing arrangement 112, the heating arrangement 114, and the control system 116 as being formed on a die 130 that is separate from the magnetic sensor die 120, in other embodiments, the magnetic sensing arrangement 110, the temperature sensing arrangement 112, the heating arrangement 114, and the control system 116 may be formed or fabricated on the same (or common) die, or the temperature sensing arrangement 112, the heating arrangement 114, and the control system 116 may each be formed or fabricated on their own individual die. In an exemplary embodiment, the ASIC die 130 also includes a sampling arrangement 122, such as an analog-to-digital converter in combination with other circuitry (e.g., amplifiers, filters, or the like), that is coupled to the output terminal of the sensor die 120 to sample the output voltage signal indicative of the ambient magnetic field that is generated by the magnetic sensing arrangement 110 and convert the sampled voltage to a digital value representative of the magnetic field sensed (or measured) by the magnetic sensing arrangement 110. In this regard, the digital value output by the sampling arrangement 122 represents a temperature uncompensated (or raw) magnetic field measurement value obtained by the magnetic sensing arrangement 110.

In an exemplary embodiment, the temperature sensing arrangement 112 is realized as a diode that is forward biased with a constant and temperature independent bias current, wherein a node and/or terminal of the diode functions as the output node of the temperature sensing arrangement 112 and provides an output voltage signal that is indicative of the voltage across the diode, which, in turn, is indicative of the ambient temperature. In a similar manner as described above in the context of the magnetic sensing arrangement 110, a second sampling arrangement 124 on the ASIC die 130 is coupled to the output node of the temperature sensing arrangement 112 to sample the output voltage signal generated by the temperature sensing arrangement 112 and convert the sampled voltage to a digital value representative of the temperature sensed (or measured) by the temperature sensing arrangement 112. As described in greater detail below in the context of FIG. 2, in exemplary embodiments, the control system 116 operates the sampling arrangement 124 in sync with the sampling arrangement 122 to obtain temperature measurements that are associated with or otherwise correspond to the raw measurement values obtained from the magnetic sensing arrangement 110 by virtue of being concurrently obtained at the same sampling time.

In the illustrated embodiment, the heating arrangement 114 is realized as a switched resistance coupled between the supply voltage node 150 and the ground voltage node 152. For example, as illustrated in FIG. 1, the heating arrangement 114 may include a resistive element 126, such as a resistor, coupled to the supply voltage node 150 and a switching element 128, such as a transistor, coupled between the resistive element 126 and the ground voltage node 152 such that the resistive element 126 and the switching element 128 are configured electrically in series between the supply voltage node 150 and the ground voltage node 152. When the switching element 128 is closed, turned on, or otherwise activated, the heating arrangement 114 provides a resistive path for current flow between the supply voltage node 150 and the ground voltage node 152, which, in turn, generates heat. In exemplary embodiments, the dies 120, 130 are encapsulated inside a single device package to provide the sensing device 102 that outputs a temperature compensated magnetic field measurement value at an output terminal (e.g., one or more output pads, pins, ports, or the like) that is coupled to a corresponding input terminal of the computing device 104 (e.g., one or more input pads, pins, ports, or the like). For example, the dies 120, 130 may be mounted or otherwise affixed to a package substrate and encapsulated with a molding compound, such as a thermosetting epoxy molding compound or the like, which fills spaces between the dies 120, 130 and protects the dies 120, 130 (and the circuitry and/or components formed thereon) from environmental elements. In this regard, the heat generated by the heating arrangement 114 is distributed throughout the device package and transferred to the sensor die 120 to heat the sensing arrangement 110 and/or sensor die 120. Thus, the heating arrangement 114 may heat the entirety of the sensor die 120 when the dies 120, 130 are encapsulated. In exemplary embodiments, the heating arrangement 114 is positioned on the ASIC die 130 so that when the dies 120, 130 are encapsulated in the device package, the heating arrangement 114 is positioned with respect to the magnetic sensing arrangement 110 and/or sensor die 120 so that heat generated by the heating arrangement 114 is transferred to the magnetic sensing arrangement 110 and/or sensor die 120 in a manner that uniformly heats the magnetic sensing arrangement 110. For example, in embodiments where the dies 120, 130 are stacked within the device package of the sensing device 102, the heating arrangement 114 may be positioned above or below the magnetic sensing arrangement 110 to uniformly heat the magnetic sensing arrangement 110. In other embodiments, the ASIC die 130 may include multiple heating arrangements 114 positioned on opposing sides of the magnetic sensing arrangement 110 and substantially equidistant from the magnetic sensing arrangement 110, as described below in the context of FIG. 6.

Similarly, in exemplary embodiments, the temperature sensing arrangement 112 is positioned on the ASIC die 130 so that when the dies 120, 130 are encapsulated in the device package, the temperature sensing arrangement 112 is positioned with respect to the magnetic sensing arrangement 110 and/or sensor die 120 to measure a temperature that corresponds to the temperature of the magnetic sensing arrangement 110. In this regard, the temperature sensing arrangement 112 may be positioned as close to the magnetic sensing arrangement 110 as possible while accounting for the floor plan and/or other layout constraints for the ASIC die 130. For example, in embodiments where the dies 120, 130 are stacked within the device package of the sensing device 102, the temperature sensing arrangement 112 may be positioned above or below the magnetic sensing arrangement 110. In other embodiments, where floor plan and/or other layout constraints for the ASIC die 130 prevent the temperature sensing arrangement 112 from being positioned above or below the magnetic sensing arrangement 110, the temperature sensing arrangement 112 may be positioned substantially equidistant from the heating arrangement(s) 114 in a manner corresponding to spacing between the magnetic sensing arrangement 110 and the heating arrangement(s) 114 to measure a temperature that is not overly influenced by one individual heating arrangement, as described below in the context of FIG. 6.

Still referring to FIG. 1, in an exemplary embodiment, the ASIC die 130 also includes the switching elements 142, 144 formed or otherwise provided thereon, with each switching element 142 being configured electrically in series between a supply voltage input of a respective sensing arrangement 110, 112 and the supply voltage node 150. In this regard, when a respective switching element 142, 144 is in an activated state (or alternatively, a closed or on state), the supply voltage at node 150 is provided to the respective sensing arrangement 110, 112 to provide current (or power) to the respective sensing arrangement 110, 112, whereas the respective sensing arrangement 110, 112 is effectively decoupled or otherwise disconnected electrically from the supply voltage when its respective switching element 142, 144 is in a deactivated state (or alternatively, an open or off state). Thus, when a switching element 142, 144 is activated, its associated sensing arrangement 110, 112 is also activated and provides an output voltage indicative of the sensed physical property, and conversely, when a switching element 142, 144 is deactivated, its associated sensing arrangement 110, 112 is also deactivated and does not consume current (or power) from the energy source coupled to the supply voltage node 150. In practice, the switching elements 142, 144 may be realized using any suitable electrically controlled switching elements, such as, for example, transistor switches.

In the illustrated embodiment, the control system 116 generally represents the combination of circuitry, hardware, processing logic and/or other components on the ASIC die 130 that is coupled to the control inputs (e.g., gate terminals) of the switching elements 128, 142, 144 and the sampling arrangements 122, 124 to operate the switching elements 128, 142, 144 and the sampling arrangements 122, 124 and deactivate the heating arrangement 114 while obtaining measurement values for the ambient magnetic field and/or the temperature. As described in greater detail below, in exemplary embodiments, the control system 116 activates the heating arrangement 114 and/or switching element 128 in response to signals from the computing device 104 and automatically deactivates the heating arrangement 114 and/or switching element 128 while operating the sampling arrangement 122 to obtain raw measurement values from the magnetic sensing arrangement 110. Depending on the embodiment, the control system 116 may be realized as a logic circuit (e.g., an ASIC), a processing core, a processing unit, a general purpose processor, a microprocessor, a microcontroller, a content addressable memory, a digital signal processor, a field programmable gate array, any suitable programmable logic device, discrete gate or transistor logic, discrete hardware components, or any combination thereof, designed to support operation of the sensing device 102 and/or perform the functions described herein. In practice, the control system 116 may also include or otherwise access a data storage element or memory 115, such as, for example, random access memory (RAM), read-only memory (ROM), flash memory, registers, or another suitable non-transitory computer-readable storage medium configured to support operation of the control system 116. For example, in some embodiments, the memory 115 may store computer-executable programming instructions that, when read and executed by the control system 116, cause the control system 116 to perform one or more additional tasks, operations, functions, and/or processes described herein.

Still referring to FIG. 1, in the illustrated embodiment, the computing device 104 generally represents the circuitry, hardware, processing logic and/or other components of the sensing system 100 coupled to the input/output terminals of the sensing device 102 and/or ASIC die 130 that controls operation of the sensing device 102 and obtains the temperature compensated magnetic field measurement values from the sensing device 102, as described in greater detail below. In this regard, in addition to having a supply and/or ground voltage input terminals and a magnetic field measurement output terminal, the sensing device 102 and/or ASIC die 130 also includes input terminals coupled to the control system 116 for receiving signals from the computing device 104 indicative of a desire to operate the magnetic sensing arrangement 110 to obtain updated magnetic field measurement values and/or signals indicative of a desire to operate the heating arrangement 114 to heat the magnetic sensing arrangement 110 and/or sensor die 120. Depending on the embodiment, the computing device 104 may include or otherwise be realized as a general purpose processor, a microprocessor, a microcontroller, a content addressable memory, a digital signal processor, a field programmable gate array, any suitable programmable logic device, discrete gate or transistor logic, discrete hardware components, or any combination thereof, designed to support operation of the sensing system 100 and/or perform additional task, functions, and/or processes described herein. In exemplary embodiments described herein, the computing device 104 is implemented using one or more device packages that are separate from the sensing device 102 but connected to the input/output terminals of the sensing device 102 and/or ASIC die 130 via an electronics substrate. In this regard, a package substrate of the sensing device 102 may be separate from the package substrate of the computing device 104, but both package substrates may be mounted to a common electronics substrate configured to facilitate communications between the sensing device 102 and the computing device 104, as described in greater detail below in the context of FIG. 5. In other embodiments, the computing device 104 and the sensing device 102 may be implemented in a common device package, for example, by mounting the computing device 104 to the same package substrate as the sensing device 102, stacking the sensing device 102 and the computing device 104, or the like.

In exemplary embodiments, the computing device 104 provides signals, instructions, or other indications of a desire to operate the magnetic sensing arrangement 110 and/or the heating arrangement 114 to calibrate the sensing device 102 for temperature and obtain temperature compensated magnetic field measurements, as described in greater detail below. In this regard, in exemplary embodiments, the ASIC die 130 includes one or more data storage elements 160 that are coupled to or otherwise accessible to the computing device 104 to receive, from the computing device 104, measurement configuration information for operating the magnetic sensing arrangement 110, such as, for example, a sampling frequency (or an amount of time to wait between operating the sampling arrangement 122 to obtain successive samples), an oversampling ratio (or a number of new raw magnetic field measurement samples to obtain), or the like. For example, the data storage elements 160 may be realized as one or more registers that are also coupled to or otherwise accessible to the control system 116. In this regard, in response to a signal, instruction, or other indication of a desire to obtain a magnetic field measurement from the computing device 104, the control system 116 automatically operates the sampling arrangement 122 and the switching element 142 in accordance with the measurement configuration information maintained by the measurement configuration registers 160. Thus, the measurement configuration information dictates the number of samples obtained and the respective sampling times of successive samples. Additionally, the ASIC die 130 also includes one or more data storage elements 170 (e.g., registers or the like) that are coupled to or otherwise accessible to the computing device 104 to receive, from the computing device 104, temperature compensation information for determining a temperature compensated measurement value based on a raw magnetic field measurement value from the magnetic sensing arrangement 110 and a corresponding temperature measurement value obtained from the temperature sensing arrangement 112. As described in greater detail below, in exemplary embodiments, the computing device 104 and the control system 116 are cooperatively configured to perform a calibration process to determine a trim code that is stored or otherwise maintained by the compensation registers 170. After the calibration process is performed, the control system 116 utilizes the trim code to calculate a temperature compensation value based on the temperature obtained from the temperature sensing arrangement 112 and adjusts the raw magnetic field measurement value obtained from the magnetic sensing arrangement 110 using the temperature compensation value to obtain a temperature compensated magnetic field measurement value that is output or otherwise provided to the computing device 104. It should be noted that although FIG. 1 depicts the memory 115 and data storage elements 160, 170 as separate components, in practice, the features and/or functionality of the data storage elements 160, 170 may be implemented by or otherwise integrated into the memory 115.

Figure 2:
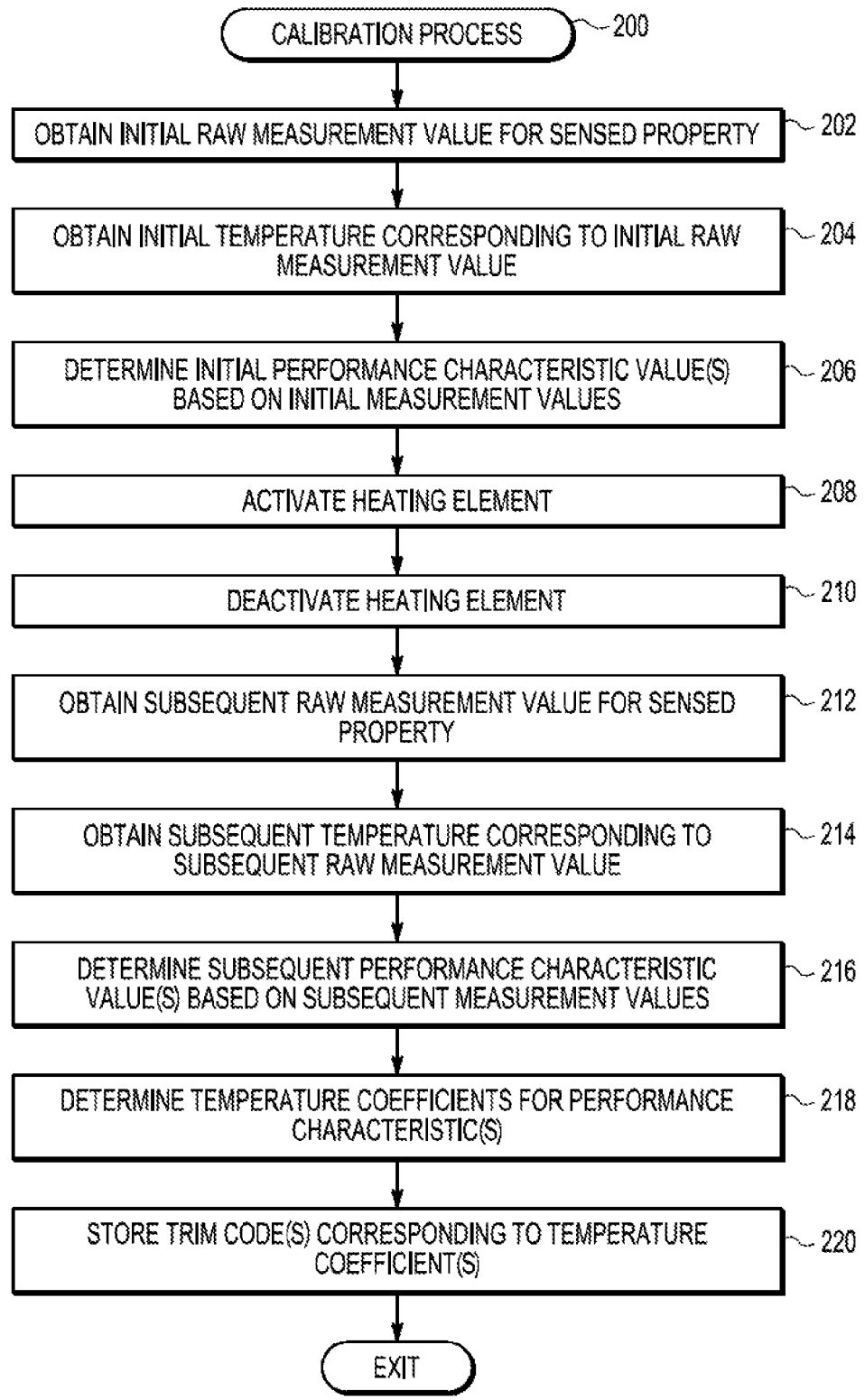
FIG. 2 is a flow diagram illustrating an exemplary calibration process suitable for implementation by the sensing device in the sensing system of FIG. 1 in accordance with one embodiment of the invention.

FIG. 2 depicts an exemplary embodiment of a calibration process 200 suitable for implementation by a sensing system to obtain temperature compensated measurement values for a sensed physical property. The various tasks performed in connection with the illustrated process 200 may be performed by hardware, software and/or firmware executed by processing circuitry or other suitable hardware, or any combination thereof. For illustrative purposes, the following description may refer to elements mentioned above in connection with FIG. 1. In practice, portions of the calibration process 200 may be performed by different elements of the sensing system 100, such as, for example, the control system 116, the heating arrangement 114, the magnetic sensing arrangement 110, the temperature sensing arrangement 112, the sampling arrangements 122, 124, the switching elements 128, 142, 144, and/or the computing device 104. It should be appreciated that practical embodiments of the calibration process 200 may include any number of additional or alternative tasks, the tasks need not be performed in the illustrated order and/or the tasks may be performed concurrently, and/or the calibration process 200 may be incorporated into a more comprehensive procedure or process having additional functionality not described in detail herein. Moreover, one or more of the tasks shown and described in the context of FIG. 2 could be omitted from a practical embodiment of the calibration process 200 as long as the intended overall functionality remains intact.

In an exemplary embodiment, the calibration process 200 initializes or otherwise begins by enabling or otherwise operating the sensing arrangement being calibrated to obtain an initial raw measurement value for a sensed property (task 202). For example, referring to FIG. 1, the computing device 104 may provide, to the control system 116, an indication of a desire to obtain an initial measurement from the magnetic sensing arrangement 110. In response to receiving the indication to obtain an initial measurement, the control system 116 operates the switching element 142 and sampling arrangement 122 in accordance with the measurement configuration information maintained by the measurement configuration register(s) 160 to obtain a desired number of raw measurements from the magnetic sensing arrangement 110. In this regard, in exemplary embodiments, the switching element 142 is initially in a deactivated state to electrically decouple the magnetic sensing arrangement 110 from the supply voltage node 150, wherein in response to receiving an indication from the computing device 104 to obtain initial raw measurements at an initial sampling time, the control system 116 activates the switching element 142 to provide the supply voltage at node 150 to the magnetic sensing arrangement 110 and the bias field arrangement 111. After activating the magnetic sensing arrangement 110 via switching element 142, the control system 116 operates the sampling arrangement 122 to obtain a raw measurement (or sample) for the ambient magnetic field. If the measurement configuration information indicates multiple raw measurements should be obtained (e.g., oversampling), the control system 116 automatically operates the sampling arrangement 122 the desired number of times at the desired sampling frequency (or data rate) to achieve the desired number of raw measurements. In this regard, the control system 116 may store the number of raw magnetic field measurements obtained from the magnetic sensing arrangement 110 via the sampling arrangement 122 and average the raw magnetic field measurements to obtain the initial average raw magnetic field measurement value corresponding to the initial sampling time as an average raw magnetic field measurement value. In an exemplary embodiment, the control system 116 deactivates the switching element 142 to decouple the magnetic sensing arrangement 110 and the bias field arrangement 111 from the supply voltage node 150 after obtaining each individual raw magnetic field measurement value and maintains the switching element 142 deactivated after the desired number of raw measurements are obtained. Additionally, in exemplary embodiments, the control system 116 ensures the heating arrangement 114 is deactivated or otherwise disabled while the sampling arrangement 122 is operated, as described in greater detail below. In this regard, the control system 116 disables or otherwise deactivates the heating arrangement 114 by opening, turning off, or otherwise deactivating the switching element 128 to prevent current flow through the resistive element 126 while the sampling arrangement 122 is operated to prevent current flowing through the heating arrangement 114 from influencing the raw magnetic field measurements obtained from the magnetic sensing arrangement 110. For example, when the switching element 128 is realized as an N-type transistor switch, the control system 116 may open or otherwise deactivate the switching element 128 by applying a voltage substantially equal to the ground voltage at node 152 (e.g., a logical low signal) to the control (or gate) terminal of the transistor switch.

Still referring to FIG. 2, in an exemplary embodiment, the calibration process 200 continues by enabling or otherwise operating the temperature sensing arrangement to obtain an initial temperature measurement value corresponding to the initial raw measurement value (task 204). In this regard, in exemplary embodiments, the control system 116 activates the switching element 144 and operates the sampling arrangement 124 concurrently to activating the switching element 142 and operating the sampling arrangement 124 to obtain a raw measurement (or sample) for the temperature of the sensor die 120 and/or the sensing device 102 at the initial sampling time that corresponds to the initial raw magnetic field measurement value obtained at the initial sampling time. For example, in response to receiving the indication to obtain an initial raw magnetic field measurement, the control system 116 may activate the switching element 144 synchronously to (or in concert with) activating the switching element 142 and operate the sampling arrangement 124 synchronously to operating the sampling arrangement 122 to thereby obtain temperature measurement values corresponding to the temperature of the magnetic sensing arrangement 110 and/or the sensor die 120 at substantially same instant in time as when the raw magnetic field measurement values were obtained via the magnetic sensing arrangement 110. As described above, the control system 116 may operate the sampling arrangement 124 to obtain the desired number of temperature measurement values, store the number of temperature measurements obtained from the temperature sensing arrangement 112 via the sampling arrangement 124, and average the temperature measurements to obtain an average temperature measurement value corresponding to the initial sampling time. In this manner, the control system 116 obtains an initial temperature measurement value ($T_{R1}$) corresponding to the initial raw magnetic field measurement value ($M_{R1}$). In an exemplary embodiment, the control system 116 deactivates the switching element 144 to decouple the temperature sensing arrangement 112 from the supply voltage node 150 after obtaining each individual temperature measurement value and maintains the switching element 144 deactivated after the desired number of raw measurements are obtained.

In an exemplary embodiment, after obtaining initial measurement values, the calibration process 200 continues by determining initial values for a performance characteristic (or property) of the sensing arrangement being calibrated based on the initial measurement value for the sensed property (task 206). In this regard, an initial value for offset, sensitivity, cross-axis sensitivity, and/or another calibrated property (or characteristic) of the sensing arrangement 110 may be determined based on the initial raw measurement value obtained from the sensing arrangement 110. For example, in accordance with one or more embodiments, the computing device 104 maintains calibration information for the magnetic sensing arrangement 110 that may be utilized to determine one or more performance characteristic values as a function of the uncompensated magnetic field measurement value and/or temperature measurement value, such as, for example, a magnetic field offset coefficient, a magnetic field sensitivity coefficient, and the like, and/or calibration equations for determining the value(s) of the respective performance characteristic (or property). In accordance with one or more embodiments, after obtaining the initial raw magnetic field measurement value and the initial temperature measurement value, the control system 116 outputs the initial raw magnetic field and temperature measurement values to the computing device 104, which, in turn, utilizes those measurement values and the calibration information to determine initial values for the one or more performance characteristics being calibrated at the initial temperature measurement value. For example, in accordance with one or more embodiments, the computing device 104 may calculate or otherwise determine an initial magnetic field offset value ($OFF_1$) as a function of the initial temperature measurement value ($T_{R1}$), the initial raw magnetic field measurement value ($M_{R1}$). Similarly, the computing device 104 may calculate or otherwise determine an initial magnetic field sensitivity value ($SENS_1$) as a function of the initial temperature measurement value, the initial raw magnetic field measurement values. In other embodiments, the control system 116 may maintain (e.g., in memory 115) the calibration information for the magnetic sensing arrangement 110, wherein the control system 116 automatically determines the initial performance characteristic values based on the initial temperature measurement value in a similar manner as described above in the context of the computing device 104.

After determining the initial compensation values, the calibration process 200 continues by enabling or otherwise activating the heating arrangement to raise the temperature of the sensing arrangement being calibrated (task 208). In this regard, after operating the sampling arrangements 122, 124 to obtain the initial magnetic field and temperature raw measurement values, the control system 116 enables or otherwise activates the heating arrangement 114 by closing, turning on, or otherwise activating the switching element 128. For example, if the switching element 128 is realized as a transistor switch, the control system 116 may apply a voltage substantially equal to the supply voltage at node 150 to the control (or gate) terminal of the transistor. In accordance with one or more embodiments, the control system 116 activates the heating arrangement 114 in response to receiving, from the computing device 104, an indication of a desire to activate the heating arrangement 114 to raise the temperature of the magnetic sensing arrangement 110 and/or the sensor die 120. In other embodiments, the control system 116 autonomously activates the heating arrangement 114 after obtaining the initial temperature and magnetic field measurements. The control system 116 maintains the heating arrangement 114 and/or switching element 128 in a continuously activated state for an amount of time dictated by the measurement configuration information and/or the computing device 104 to allow heat generated by the heating arrangement 114 on the ASIC die 130 to be transferred to the sensor die 120 to raise the temperature of the magnetic sensing arrangement 110.

After the heating arrangement is activated, the calibration process 200 continues by deactivating the heating arrangement while obtaining a subsequent raw measurement value for the sensed property and a corresponding subsequent temperature measurement value (tasks 210, 212, 214). In this regard, the control system 116 automatically disables or otherwise deactivates the heating arrangement 114 by opening, turning off, or otherwise deactivating the switching element 128 while the output of the magnetic sensing arrangement 110 is sampled at the subsequent sampling time so that the current flowing through the heating arrangement 114 does not influence the ambient magnetic field measurement obtained from the magnetic sensing arrangement 110 at the subsequent sampling time. In this regard, the ambient magnetic field is preferably unchanged relative to the initial sampling time, such that any variations in the raw magnetic field measurement value relative to the initial raw magnetic field measurement value are attributable to the change in temperature of the magnetic sensing arrangement 110 and/or the sensor die 120.

In a similar manner as described above, the control system 116 activates the switching element 142 to enable or otherwise operate the magnetic sensing arrangement 110 and operates the sampling arrangement 122 to obtain a raw measurement (or sample) for the ambient magnetic field corresponding to the subsequent sampling time while the heating arrangement 114 and/or switching element 128 is deactivated. In accordance with one or more embodiments, the control system 116 deactivates the switching element 128 in sync with operating the sampling arrangements 122 to sample the outputs of the magnetic sensing arrangement 110 so that the magnetic field measurement value is obtained while the magnetic sensing arrangement 110 and/or the magnetic sensor die 120 is at the elevated temperature. To put it another way, any cooling of the magnetic sensing arrangement 110 and/or the magnetic sensor die 120 prior to sampling the output of the magnetic sensing arrangement 110 is negligible. Additionally, the control system 116 activates the switching element 144 to enable or otherwise operate the temperature sensing arrangement 112, operates the sampling arrangement 124 concurrently to operating the sampling arrangement 122 to obtain a temperature measurement that corresponds to the temperature of the magnetic sensing arrangement 110 and/or the sensor die 120 at the subsequent sampling time when the subsequent raw magnetic field measurement value is obtained. In accordance with one or more embodiments, the control system 116 automatically reactivates or otherwise re-enables the heating arrangement 114 after obtaining the raw measurements. For example, if an indication of a desire to activate the heating arrangement 114 is maintained by the computing device 104 and/or the measurement configuration information indicates multiple raw measurements should be obtained, the control system 116 automatically activates the heating arrangement 114 and/or switching element 128 between successive samples of the outputs of the sensing arrangements 110, 112. In this regard, in accordance with one or more embodiments, for each sample, the control system 116 deactivates the switching element 128 in sync with operating the sampling arrangements 122, 124 to sample the outputs of the sensing arrangements 110, 112 and activates the switching element 128 in sync with ceasing operation of the sampling arrangements 122, 124 so that the heating arrangement 114 is activated and current flows through the resistive element 126 when the outputs of the sensing arrangements 110, 112 are not being sampled.

In a similar manner as described above, after successively operating the sampling arrangements 122, 124 while concurrently deactivating the heating arrangement 114 to obtain the desired number of raw measurements, the control system 116 may average the raw magnetic field measurements to obtain a subsequent raw magnetic field measurement value ($M_{R2}$) corresponding to the subsequent sampling time and average the temperature measurements to obtain a subsequent temperature measurement value ($T_{R2}$) corresponding to the subsequent sampling time. In some embodiments, if an indication of a desire to activate the heating arrangement 114 is maintained by the computing device 104, the control system 116 maintains the heating arrangement 114 and/or switching element 128 in an activated state after obtaining the subsequent raw measurement values. In other embodiments, the control system 116 may deactivate the heating arrangement 114 after obtaining the subsequent raw measurement values and maintain the heating arrangement 114 in the deactivated state until receiving a subsequent indication of a desired to activate the heating arrangement 114 from the computing device 104.

After obtaining subsequent raw measurement values, the calibration process 200 continues by determining subsequent performance characteristic values at the subsequent temperature based on the subsequent measurement values and calibration information for the sensing arrangement (task 216) in a similar manner as described above (e.g., task 206). For example, the control system 116 may output the subsequent raw magnetic field and temperature measurement values to the computing device 104, which, in turn, calculates or otherwise determines a second magnetic field offset value (OFF$_2$) or a second magnetic field sensitivity value (SENS$_2$) as a function of the subsequent raw magnetic field measurement value (M$_{R2}$) and/or subsequent temperature measurement value (T$_{R2}$) using the calibration information for the magnetic sensing arrangement 110. As described above, in other embodiments, the control system 116 may maintain (e.g., in memory 115) the calibration information for the magnetic sensing arrangement 110, wherein the control system 116 automatically determines the subsequent performance characteristic values based on the subsequent magnetic field and temperature measurement values in a similar manner as described above in the context of the computing device 104.

In the illustrated embodiment of FIG. 2, after determining subsequent compensation values, the calibration process 200 continues by determining temperature coefficients for the performance characteristics based on the different values for the performance characteristics at the different temperatures (task 218). In this regard, the temperature coefficients account for variations in a performance characteristic (e.g., the magnetic field offset, the magnetic field sensitivity, or the like) with respect to the temperature of the magnetic sensing arrangement 110 and/or the sensor die 120 which may be subsequently utilized to provide a more accurate temperature compensated magnetic field measurement value. In accordance with one embodiment, the temperature coefficient for a respective performance characteristic is determined using linear regression based on the changes in the performance characteristic value with respect to the changes in temperature. For example, the magnetic field offset temperature coefficient may be determined to be $$C_{TO} = \frac{OFF_2 - OFF_1}{T_{R2} - T_{R1}}.$$

In practice, the temperature coefficients may be determined using any suitable method for solving systems of equations or any suitable regression analysis. To put it another way, the temperature coefficients may be determined using higher order equations (or functions) and/or as a function of other variables and/or measurement values in addition to the temperature of the magnetic sensing arrangement 110 and/or the sensor die 120. It will be appreciated that the order of the equation used to determine a respective temperature coefficient may vary depending on the needs of a particular embodiment. In this regard, for higher order temperature coefficient determinations, the calibration process 200 may repeat the tasks of activating the heating arrangement and obtaining additional subsequent measurements (tasks 208, 210, 212, 214, 216) to provide additional degrees of freedom and/or additional data points.

Still referring to FIG. 2, after the temperature coefficient(s) information are determined, the calibration process 200 continues by storing the trim code(s) corresponding to the temperature coefficient(s) for use in determining subsequent temperature compensated measurement values (task 220). In accordance with one or more embodiments, the trim code is determined by converting the temperature coefficient to a digital value (or code) that is stored or otherwise maintained in the compensation register(s) 170 to allow the control system 116 to determine temperature compensation values and output temperature compensated magnetic field measurement values by adjusting subsequent raw magnetic field measurement values using the trim code. In accordance with one or more embodiments, the computing device 104 determines the magnetic field offset and sensitivity trim codes based on their respective temperature coefficients (C$_{TO}$ and C$_{TS}$) and stores or otherwise provides the trim codes (C$_{TO}$ and C$_{TS}$) to the compensation register(s) 170. In other embodiments, the control system 116 determines the temperature coefficients and corresponding trim codes and stores the trim codes in either the compensation register(s) 170 or memory 115.

Figure 3:
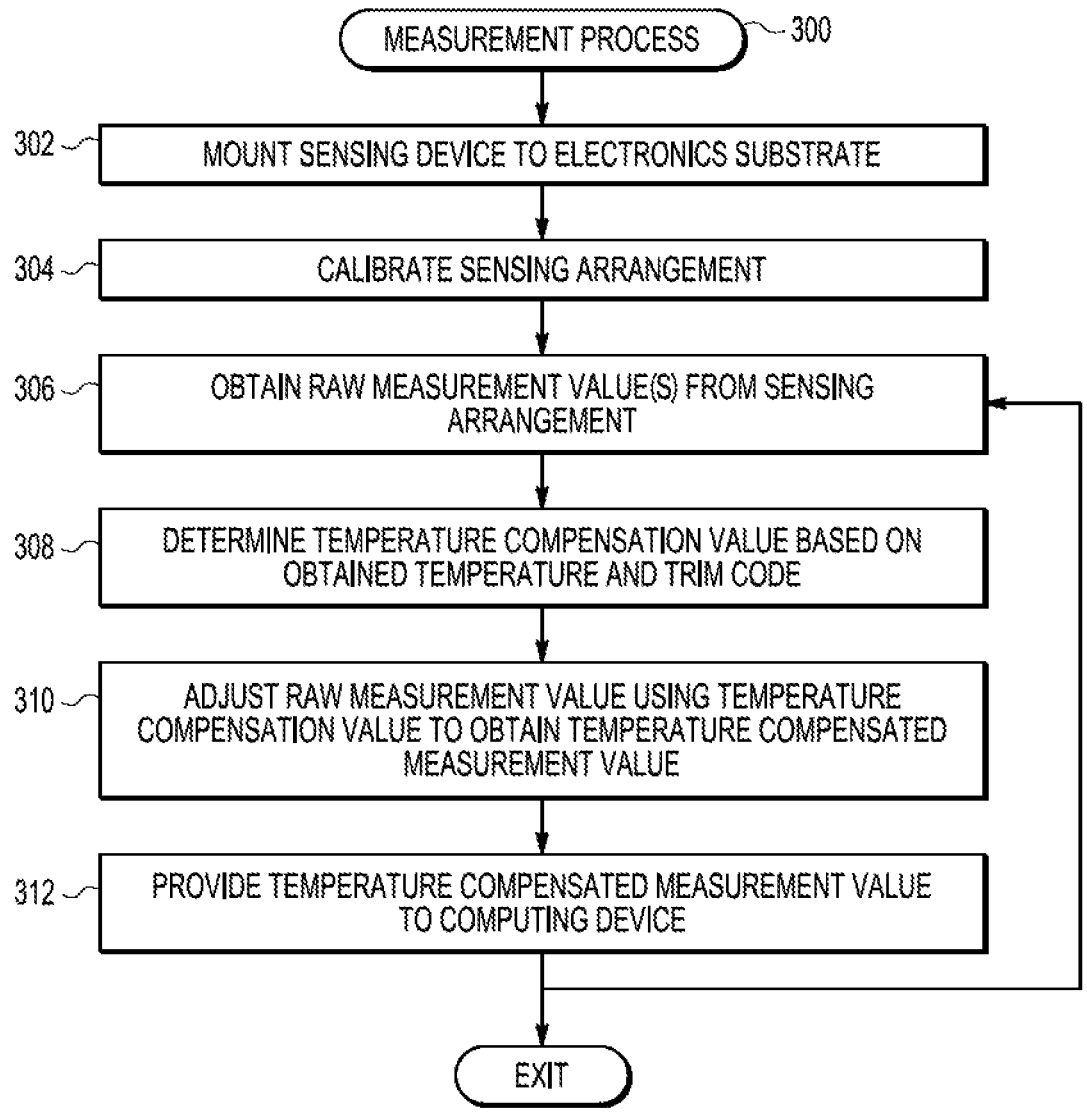
FIG. 3 is a flow diagram illustrating an exemplary measurement process suitable for implementation by the sensing system of FIG. 1 in conjunction with the calibration process of FIG. 2 in accordance with one embodiment of the invention.

FIG. 3 depicts an exemplary embodiment of a measurement process 300 suitable for implementation by a sensing system to obtain temperature-compensated measurement values for a sensed physical property in conjunction with the calibration process 200 of FIG. 2. The various tasks performed in connection with the illustrated process 300 may be performed by hardware, software and/or firmware executed by processing circuitry or other suitable hardware, or any combination thereof. For illustrative purposes, the following description may refer to elements mentioned above in connection with FIG. 1. In practice, portions of the measurement process 300 may be performed by different elements of the sensing system 100, such as, for example, the computing device 104, the control system 116, the magnetic sensing arrangement 110, the temperature sensing arrangement 112, the heating arrangement 114, the sampling arrangements 122, 124 and/or the switching elements 128, 142, 144. It should be appreciated that practical embodiments of the measurement process 300 may include any number of additional or alternative tasks, the tasks need not be performed in the illustrated order and/or the tasks may be performed concurrently, and/or the measurement process 300 may be incorporated into a more comprehensive procedure or process having additional functionality not described in detail herein. Moreover, one or more of the tasks shown and described in the context of FIG. 3 could be omitted from a practical embodiment of the measurement process 300 as long as the intended overall functionality remains intact.

In an exemplary embodiment, the measurement process 300 begins by mounting the sensing device including the sensing arrangement to be calibrated to an electronics substrate (task 302). In this regard, the sensing device 102 including the magnetic sensing arrangement 110 is mounted to an electronics substrate, for example, by soldering, bonding, or otherwise affixing the sensing device 102 to the electronics substrate, as described in greater detail below in the context of FIG. 5. The electronics substrate may be realized as a printed circuit board (PCB), an interposer, or another suitable structure configured to mechanically support the sensing device 102 and provide electrical connectivity to/from the sensing device 102. In an exemplary embodiment, the electronics substrate provides electrical interconnections between the computing device 104 and the sensing device 102 and/or control system 116 to support operation of the calibration process 200 described above in the context of FIG. 2. Depending on the embodiment, the computing device 104 may be mounted to the electronics substrate before or after the sensing device 102 is mounted to the electronics substrate.

After the sensing device is mounted to the electronics substrate, the measurement process 300 continues by calibrating a sensing arrangement on the sensing device (task 304). In this regard, in exemplary embodiments, the measurement process 300 continues by calibrating the magnetic sensing arrangement 110 of the sensing device 102 by performing the calibration process 200 described above in the context of FIG. 2. For example, after the sensing device 102 is mounted to the electronics substrate, the computing device 104 signals or otherwise provides to the control system 116, via the interconnections provided by the electronics substrate, an indication of a desire to obtain initial raw magnetic field and temperature measurement values (e.g., tasks 202, 204). In response, the control system 116 activates the switching elements 142, 144 and concurrently operates the sampling arrangements 122, 124 a desired number of times to obtain an initial raw magnetic field measurement value and an initial temperature measurement value corresponding to an initial sampling time. In accordance with one or more embodiments, the control system 116 provides the initial raw magnetic field measurement value and the initial temperature measurement value to the computing device 104, wherein the computing device 104 determines one or more initial performance characteristic values based on the initial magnetic field and temperature measurement values (e.g., task 206). After the initial measurement values are obtained, in an exemplary embodiment, the computing device 104 signals or otherwise provides to the control system 116, via the interconnections provided by the electronics substrate, an indication of a desire to activate the heating arrangement 114 and obtain subsequent raw magnetic field and temperature measurement values (e.g., tasks 208, 210, 212, 214). As described above, the control system 116 activates the heating arrangement 114 and/or switching element 128 for a desired amount of time and then activates the switching elements 142, 144 and concurrently operates the sampling arrangements 122, 124 a desired number of times to obtain a subsequent raw magnetic field measurement value and a subsequent temperature measurement value while deactivating the heating arrangement 114 when the sampling arrangements 122, 124 are operated to sample the outputs of the sensing arrangements 110, 112. In accordance with one or more embodiments, the control system 116 provides the subsequent raw magnetic field measurement value and the subsequent temperature measurement value to the computing device 104, wherein the computing device 104 determines one or more subsequent performance characteristic values based on the subsequent magnetic field and temperature measurement values, determines temperature coefficients for the performance characteristic values based on the relationship between initial performance characteristic values at the initial raw measurement temperature with respect to the subsequent performance characteristic values at the subsequent raw measurement temperature, determines the trim codes corresponding to those temperature coefficients, and stores the trim codes in the compensation register(s) 170 (e.g., task 216, 218, 220). In accordance with one or more embodiments, after completing the calibration process 200, the computing device 104 signals or otherwise indicates a desire to deactivate the heating arrangement 114, wherein the control system 116 deactivates or otherwise disables the heating arrangement 114 and/or switching element 128.

Still referring to FIG. 3, in an exemplary embodiment, after calibrating the sensing device, the measurement process 300 continues by operating the sensing arrangements to obtain subsequent raw measurements (task 306). In this regard, after completing the calibration process 200, when a new magnetic field measurement value is desired, the computing device 104 signals or otherwise provides indication of a desire to obtain a new magnetic field measurement value from the sensing device 102. In a similar manner as described above, the control system 116 activates the switching elements 142, 144 and concurrently operates the sampling arrangements 122, 124 a desired number of times to obtain an updated raw magnetic field measurement value (e.g., $M_U$) and an updated temperature measurement value (e.g., $T_U$) corresponding to that most recent sampling time.

After the calibration process is completed, the measurement process 300 continues by determining a temperature compensation value based on the current temperature of the sensing device and the stored trim code, adjusting the raw measurement value using the temperature compensation value to obtain a temperature compensated measurement value, and outputting or otherwise providing the temperature compensated measurement value to the computing device (tasks 308, 310, 312). In this regard, the control system 116 calculates a temperature compensation value using the updated temperature measurement value obtained via the temperature sensing arrangement 112 and the trim code maintained in the compensation register(s) 170 to compensate for the current temperature of the magnetic sensing arrangement 110 and/or the sensor die 120. In various embodiments, the temperature compensation value may be added to and/or subtracted from the updated raw magnetic field measurement value, the updated raw magnetic field measurement value may be scaled by multiplying and/or dividing the updated raw magnetic field measurement value by the temperature compensation value, or the updated raw magnetic field measurement value may be modified in another suitable manner using the temperature compensation value. For example, in accordance with one embodiments, the control system 116 calculates a magnetic field offset temperature compensation value (e.g., $O_{TC}$) by multiplying the trim code by the difference between the updated (e.g., the current or most recently obtained) temperature measurement value and the initial temperature measurement value (e.g., $O_{TC} = C_{TO} \times (T_U - T_{R1})$), and calculates the temperature compensated magnetic field measurement value (e.g., $M_{TC}$) by adding the calculated magnetic field offset temperature compensation value to the updated (e.g., the current or most recently obtained) raw magnetic field measurement value (e.g., $M_{TC} = M_U + O_{TC}$) to compensate for changes to the magnetic field offset of the magnetic sensing arrangement 110 attributable to temperature. In this manner, the calibrated magnetic field offset implemented or otherwise provided on the magnetic sensor die 120 may be trimmed for temperature variations after the sensing device 102 is soldered, mounted, or otherwise affixed to an electronics substrate. In exemplary embodiments, the control system 116 provides the temperature compensated magnetic field measurement value as an output to the computing device 104 via the electrical interconnections provided by the electronics substrate. The loop defined by tasks 306, 308, 310 and 312 may repeat throughout operation of the sensing system 100. When the sensing device 102 needs to be recalibrated, the computing device 104 signals, instructs, or otherwise operates the sensing device 102 to repeat the calibration process 200 (e.g., task 304) before continuing the loop defined by tasks 306, 308, 310 and 312. In accordance with one or more embodiments, the control system 116 automatically determines to repeat the calibration process 200 when the current temperature of the sensing device 102 deviates from the initial temperature measurement value by more than a threshold value or when the amount of time that has elapsed since the previous iteration of the calibration process 200 exceeds a threshold amount of time.

Figure 4:
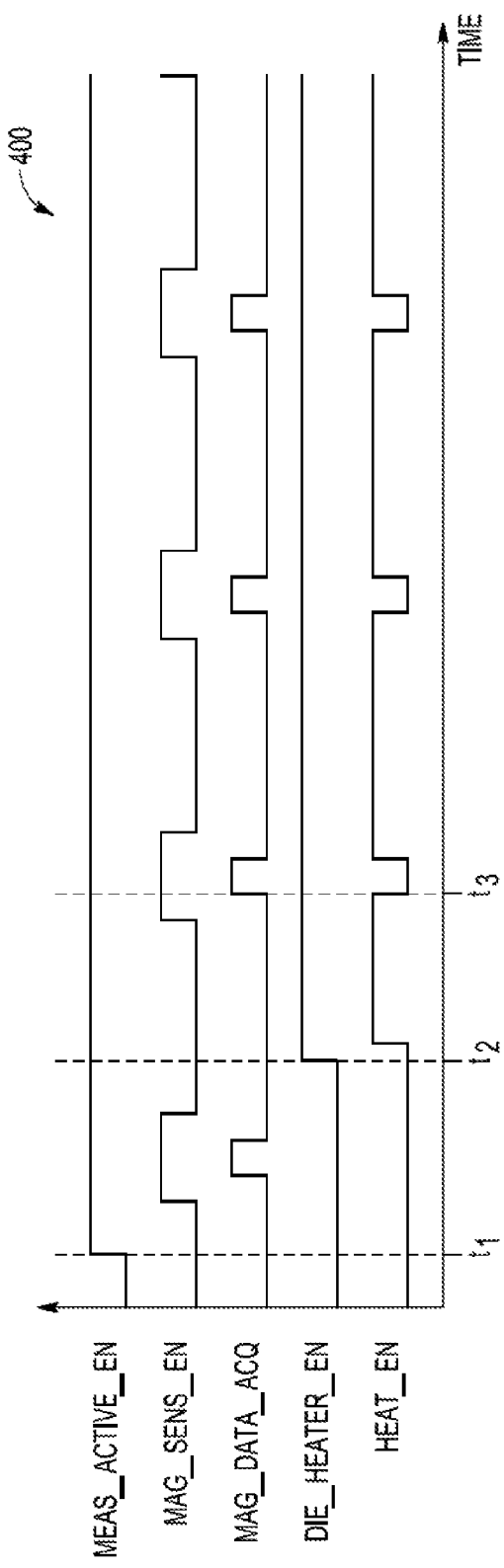
FIG. 4 is a timing diagram illustrating signals received and/or provided by a control system of a sensing device in conjunction with one exemplary implementation of the calibration process of FIG. 2.

FIG. 4 depicts a timing diagram 400 illustrating an exemplary embodiment of implementation of the calibration process 200 of FIG. 2 by the sensing system 100 of FIG. 1. As illustrated, at some initial time ($t_1$), the computing device 104 asserts a measurement signal ('meas_active_en') or otherwise provides, to the control system 116, an indication of a desire to begin obtaining magnetic field measurements. In response to receiving the signal from the computing device 104, the control system 116 asserts or otherwise provides a signal ('mag_sens_en') to activate the switching element 142 and thereby activate the magnetic sensing arrangement 110. After activating the magnetic sensing arrangement 110, the control system 116 asserts or otherwise provides a signal ('mag_data_acq') to operate the sampling arrangement 122 to sample or otherwise acquire the output of the magnetic sensing arrangement 110 as an initial raw magnetic field measurement value. As described above, in exemplary embodiments, the control system 116 also activates the switching element 144 concurrently to activating switching element 142 and operates sampling arrangement 124 concurrently to operating sampling arrangement 122 to obtain an initial temperature measurement value. After operating the sampling arrangements 122, 124, the control system 116 deactivates the sensing arrangements 110, 112 via switching elements 142, 144. The control system 116 may store the raw magnetic field and temperature measurement values or output or otherwise provide the raw magnetic field and temperature measurement values to the computing device 104.

At some subsequent time ($t_2$), the computing device 104 asserts a heater signal ('die_heater_en') or otherwise provides, to the control system 116, an indication of a desire to heat the magnetic sensing arrangement 110 and/or magnetic sensor die 120. In response to receiving the heater signal from the computing device 104, the control system 116 asserts or otherwise provides a signal ('heat_en') to activate the switching element 128 and thereby activate the heating arrangement 114 to allow current flow through the resistive element 126. After activating the heating arrangement 114, the control system 116 activates the magnetic sensing arrangement 110 (e.g., by asserting 'mag_sens_en') to facilitate obtaining an updated raw magnetic field measurement value at some subsequent sampling time ($t_3$) dictated by the measurement configuration information maintained in the measurement configuration register(s) 160. After activating the magnetic sensing arrangement 110, the control system 116 operates the sampling arrangement 122 to sample or otherwise acquire the output of the magnetic sensing arrangement 110 as the updated raw magnetic field measurement value at that subsequent sampling time ($t_3$). As illustrated, the control system 116 deactivates the heating arrangement 114 (e.g., by deasserting 'heat_en') in sync with operating the sampling arrangement 122 to prevent current flow through the resistive element 126 while the output of the magnetic sensing arrangement 110 is sampled. To put it another way, the control system 116 autonomously deactivates the heating arrangement 114 at the prescribed sampling time ($t_3$) while the heater signal is asserted. In the illustrated embodiments, the control system 116 autonomously reactivates the heating arrangement 114 in sync with ceasing operation of the sampling arrangement 122 to resume current flow through the resistive element 126 while the heater signal is asserted. As described above, the control system 116 may store the updated raw magnetic field and temperature measurement values or output or otherwise provide the updated raw magnetic field and temperature measurement values to the computing device 104 for determining the temperature coefficients and trim codes.

In the illustrated timing diagram 400, the control system 116 continuously operates the switching elements 142, 144 and sampling arrangements 122, 124 in accordance with the measurement configuration information maintained in the measurement configuration register(s) 160 to obtain raw measurements while the measurement signal ('meas_active_en') is asserted. In this regard, while the heater signal is asserted, the control system 116 automatically deactivates the heating arrangement 114 in sync with operating the sampling arrangements 122, 124 to prevent current flowing through the resistive element 126 from influencing the magnetic field sensed by the sensing arrangement 110 and/or to prevent heat generated by the heating arrangement 114 from influencing the temperature sensed by the temperature sensing arrangement 112 and automatically reactivates the heating arrangement 114 when the sampling arrangements 122, 124 are no longer sampling the outputs of the sensing arrangements 110, 112.

Referring to FIGS. 2-4, in accordance with an alternative embodiment, the heating arrangement 114 may be initially activated prior to performing the calibration process 200 or otherwise prior to obtaining the initial measurements used in determining the temperature coefficients. For example, at some initial time, the computing device 104 may assert the heater signal or otherwise provide an indication of a desire to heat the magnetic sensing arrangement 110 and/or magnetic sensor die 120. In response to receiving the heater signal from the computing device 104, the control system 116 asserts or otherwise provides a signal ('heat_en') to activate the switching element 128 and thereby activate the heating arrangement 114 to allow current flow through the resistive element 126. Subsequently, the computing device 104 asserts a measurement signal or otherwise provides an indication of a desire to begin obtaining magnetic field measurements, wherein the control system 116 responds by activating the magnetic sensing arrangement 110 and deactivating the heating arrangement 114 while operating the sampling arrangements 122, 124 to obtain initial measurement values. After the initial measurement values are obtained, the computing device 104 may remove or otherwise deassert the heater signal. In response, the control system 116 deactivates the heating arrangement 114, thereby allowing the magnetic sensing arrangement 110 and/or magnetic sensor die 120 to cool down or otherwise lower in temperature before obtaining subsequent measurement values at that lower temperature. In this manner, the subsequent measurement values used to calculate the subsequent performance characteristic value(s) and temperature coefficient(s) are obtained while the magnetic sensing arrangement 110 and/or magnetic sensor die 120 has a lower temperature than the initial temperature corresponding to the initial measurement values.

Figure 5:
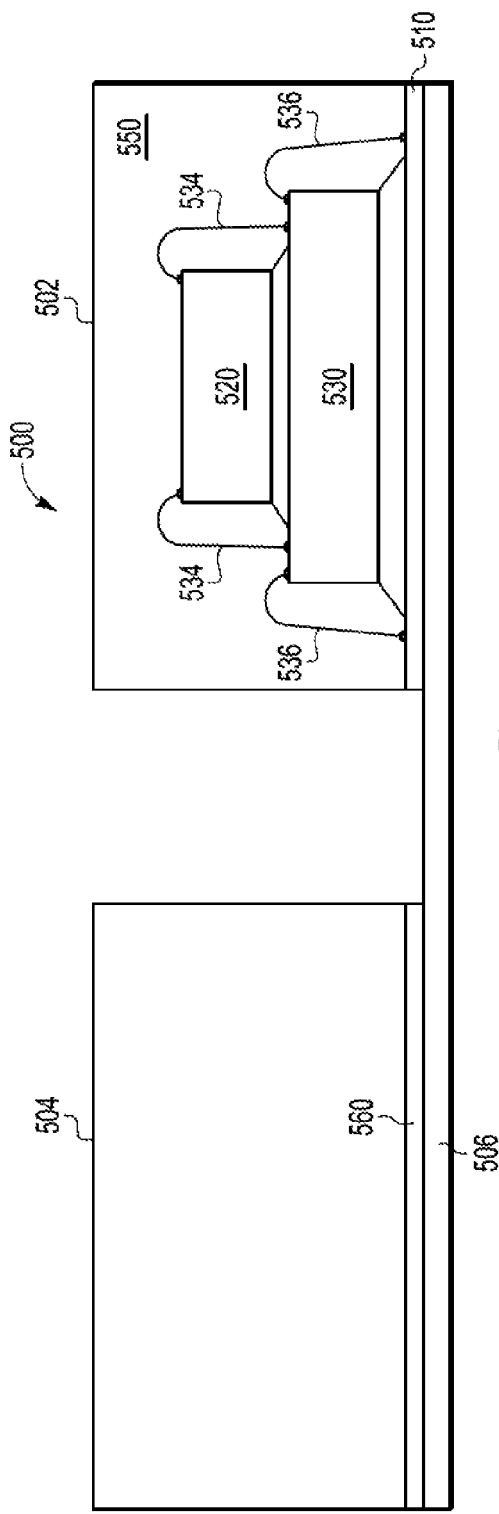
FIG. 5 depicts a cross-sectional view of an exemplary embodiment of the a sensing system illustrating a sensing device having a stacked die configuration in accordance with one embodiment of the invention.

FIG. 5 depicts cross-sectional view of an exemplary sensing system 500 including a sensing device package 502 (e.g., sensing device 102) and a computing device package 504 (e.g., computing device 104) mounted to a common electronics substrate structure 506. In this regard, FIG. 5 depicts one exemplary embodiment of the sensing system 100 of FIG. 1. In the illustrated embodiment, the sensing device 502 includes an ASIC die 530 (e.g., ASIC die 130) that is affixed, bonded, or otherwise mounted to a package substrate structure 510, for example, by using an epoxy or silicone adhesive. The package substrate structure 510 may be realized as a lead frame structure, an interposer, a circuit board, or another suitable electronics substrate including conductive traces and/or other electrical interconnections, solder balls, or the like to provide a desired mounting configuration and a desired electrical connectivity to/from the ASIC die 530 and the electronics substrate 506 when mounted to the electronics substrate 506. The sensing device 502 also includes a sensor die 520 (e.g., sensor die 120) that is affixed, bonded, or otherwise mounted to the upper surface of the ASIC die 530 in a similar manner. In the illustrated embodiments, the topside surfaces of the dies 520, 530 include conductive bonding pads (or contact pads) that function as input/output terminals for providing and/or receiving electrical signals to/from the dies 520, 530, wherein conductive wire bonds 534 are formed between the bonding pad(s) on the topside surface of the sensor die 520 and corresponding bonding pad(s) on the topside surface of the ASIC die 530 to provide electrical connections between the dies 520, 530 (e.g., from the output of the magnetic sensing arrangement 110 to the input of the sampling arrangement 122), and similarly, wire bonds 536 are formed between bonding pad(s) on the topside surface of the ASIC die 530 and the package substrate structure 510 to provide electrical connections to the electronics substrate 506 that the sensing device 502 is subsequently mounted to. After affixing the dies 520, 530 to the package substrate structure 510 and forming the wire bonds 534, 536, fabrication of the sensor device package 502 continues by forming a molding compound 550, such as a thermosetting epoxy molding compound, overlying the dies 520, 530 to encapsulate the dies 520, 530 and the wire bonds 534, 536. It should be noted that although not illustrated in FIG. 5, in practical embodiments, the sensing device 502 may include additional dies stacked above the sensor die 520 or below the ASIC die 530. Furthermore, in other embodiments, the ASIC die 530 may be stacked above the sensor die 520.

In an exemplary embodiment, the electronics substrate structure 506 is realized as a PCB, interposer, or another suitable structure capable of providing physical support to, and electrical connectivity between, the device packages 502, 504. In this regard, the package substrate structure 510 of the sensing device package 502 is affixed, bonded, soldered, or otherwise mounted to the electronics substrate 506 in a manner that provides electrical connections between the ASIC die 530 and the electronics substrate 506 via wire bonds 536. In a similar manner, the computing device package 504 includes a package substrate structure 560 that is affixed, bonded, soldered, or otherwise mounted to the electronics substrate 506, such that the electronics substrate 506 provides electrical connections between the computing device 504 and the ASIC die 530 to support operation of the calibration process 200 of FIG. 2 and/or the measurement process 300 of FIG. 3, as described above. In practice, the physical and/or thermal stress exerted on the sensing device package 502 stresses the dies 520, 530 contained therein, which, in turn, influences the performance of the sensing arrangement provided on the sensor die 520. For example, in the case of a magnetic sensing arrangement 110 on the sensor die 520, stress from soldering the sensing device package 502 to the electronics substrate 506 may increase and/or decrease its magnetic field sensitivity, magnetic field offset, and the like.

Figure 6:
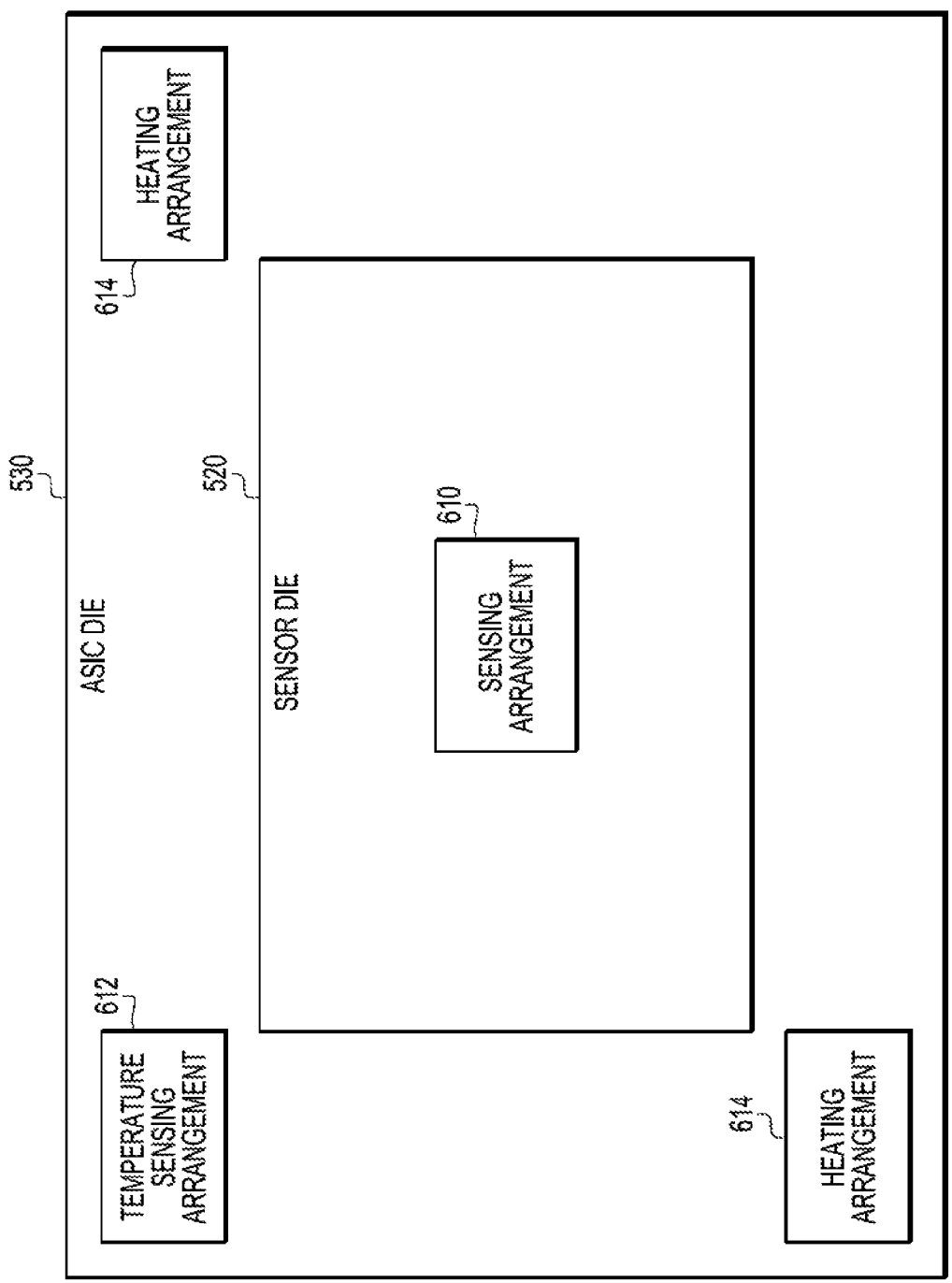
FIG. 6 depicts a top view of an exemplary embodiment of the stacked die configuration of the sensing device of FIG. 5 in accordance with one embodiment of the invention.

FIG. 6 depicts a top view of an exemplary embodiment of the stacked die configuration illustrated in FIG. 5. In the illustrated embodiment, the ASIC die 530 includes a pair of heating arrangements 614 (e.g., heating arrangement 114) formed on the topside surface of the ASIC die 530 that are disposed on opposing sides of the sensor die 520, for example, at or near opposing corners of the ASIC die 530. In exemplary embodiments, the heating arrangements 614 are substantially equidistant from the sensing arrangement 610 to evenly heat the sensing arrangement 610 from opposing sides. In the illustrated embodiment, the temperature sensing arrangement 612 is formed on the topside surface of the ASIC die 530 substantially equidistant from each of the heating arrangements 614, such that the temperature sensed or otherwise measured by the temperature sensing arrangement 612 is not overly influenced by an individual heating arrangement 614. In one or more embodiments, the temperature sensing arrangement 612 is positioned substantially equidistant from the heating arrangements(s) 614 by an amount corresponding to the equidistant spacing between the magnetic sensing arrangement 610 and the heating arrangements(s) 614 so that temperature fluctuations of the temperature sensing arrangement 612 attributable to the heating arrangement(s) 614 being activated correspond to the anticipated temperature fluctuations experienced by the magnetic sensing arrangement 610. It should be noted that FIG. 6 depicts merely one exemplary configuration of the heating arrangements 614 and temperature sensing arrangement 612 with respect to the sensing arrangement 610 and/or sensor die 520, and in practice, the location of the heating arrangements 614 and/or temperature sensing arrangement 612 will vary depending on floor plan constraints and the needs of a particular embodiment. For example, in some embodiments, the ASIC die 530 may include additional heating arrangements 614 surrounding the sensing arrangement 610 and/or the sensor die 520, and/or the temperature sensing arrangement 612 may be disposed beneath the sensing arrangement 610 to more accurately measure the temperature of the sensing arrangement 610. In yet other embodiments, the heating arrangements 614 may be provided underneath the sensor die 520 and/or underneath the sensing arrangement 610.

For the sake of brevity, conventional techniques related to magnetic sensing, temperature sensing, calibration methods, semiconductor and/or integrated circuit fabrication, MEMS devices, device packaging, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context. As used herein, a "node" means any internal or external reference point, connection point, junction, signal line, conductive element, or the like, at which a given signal, logic level, voltage, data pattern, current, or quantity is present.

The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the figures may depict direct electrical connections between circuit elements and/or terminals, alternative embodiments may employ intervening circuit elements and/or components while functioning in a substantially similar manner.

In conclusion, systems, devices, and methods configured in accordance with example embodiments of the invention relate to:

An embodiment for a sensing device is provided. The sensing device comprises a first sensing arrangement on a first substrate to sense a first property, a heating arrangement, and a control system coupled to the first sensing arrangement and the heating arrangement to activate the heating arrangement to heat the first substrate and to deactivate the heating arrangement while obtaining one or more measurement values for the first property from the first sensing arrangement. In one embodiment, the sensing device further comprises a temperature sensing arrangement, wherein the control system is coupled to the temperature sensing arrangement to obtain one or more measured temperature values from the temperature sensing arrangement concurrently to obtaining the one or more measurement values for the first property. In a further embodiment, the sensing device comprises a storage element to maintain a trim code for the first sensing arrangement, wherein the control system is coupled to the storage element to determine a temperature compensation value based on the trim code and the one or more measured temperature values and output a temperature compensated measurement value for the first property based on the temperature compensation value and the one or more measurement values for the first property. In another embodiment, the sensing device further comprises a second substrate having the heating arrangement disposed thereon. In one embodiment, the control system is disposed on the second substrate. In another embodiment, the first substrate and the second substrate are encapsulated in a single device package. In yet another embodiment, a temperature sensing arrangement is provided on the second substrate, wherein the control system is coupled to the temperature sensing arrangement to obtain one or more measured temperature values from the temperature sensing arrangement corresponding to the one or more measurement values for the first property. In yet another embodiment, the first substrate and the second substrate are stacked. In accordance with another embodiment, the first sensing arrangement comprises a magnetic sensing arrangement configured to sense an ambient magnetic field.

In another exemplary embodiment, a method is provided for calibrating a sensing arrangement disposed on a semiconductor substrate. The method comprises obtaining, from the sensing arrangement, a first measurement value for a first property sensed by the sensing arrangement that corresponds to a first temperature, activating a heating arrangement to heat the semiconductor substrate after obtaining the first measurement value, and after activating the heating arrangement, obtaining, from the sensing arrangement, a second measurement value for the first property that corresponds to a second temperature and deactivating the heating arrangement while obtaining the second measurement value. In one embodiment, the method further comprises obtaining, from the sensing arrangement after obtaining the second measurement value, a third measurement value for the first property that corresponds to a third temperature, determining a temperature compensation value based on the third temperature and a trim code for the sensing arrangement, wherein the trim code is determined based at least in part on the first measurement value, the first temperature, the second measurement value, and the second temperature, and adjusting the third measurement value by the temperature compensation value to obtain a temperature compensated measurement value for the first property. In another embodiment, deactivating the heating arrangement comprises deactivating the heating arrangement concurrently to operating a sampling arrangement coupled to an output of the sensing arrangement to obtain the second measurement value. In yet another embodiment, the heating arrangement is disposed on a second semiconductor substrate encapsulated with the semiconductor substrate in a device package, wherein the method further comprises obtaining, from a temperature sensing arrangement on the second semiconductor substrate, a first temperature measurement value corresponding to the first temperature concurrently to obtaining the first measurement value and obtaining, from the temperature sensing arrangement, a second temperature measurement value corresponding to the second temperature concurrently to obtaining the second measurement value. In a further embodiment, the method further comprises mounting the device package to an electronics substrate prior to obtaining the first measurement value, wherein activating the heating arrangement comprises receiving an indication from a computing device mounted to the electronics substrate and activating the heating arrangement in response to receiving the indication. In one embodiment, deactivating the heating arrangement comprises deactivating the heating arrangement while the indication is asserted. In another embodiment, the method further comprises storing a trim code determined based at least in part on the first measurement value, the first temperature measurement value, the second measurement value, and the second temperature measurement value, obtaining, from the sensing arrangement after obtaining the second measurement value, a third measurement value for the first property, obtaining, from the temperature sensing arrangement, a third temperature measurement value corresponding to the second temperature concurrently to obtaining the third measurement value, determining a temperature compensation value based on the third temperature measurement value and the trim code, adjusting the third measurement value by the temperature compensation value to obtain a temperature compensated measurement value for the first property, and providing the temperature compensated measurement value to the computing device.

In yet another embodiment, an embodiment of a sensing system is provided that comprises a first substrate having a magnetic sensing arrangement provided thereon, and a second substrate. The second substrate includes a heating arrangement configured to heat the first substrate and a control system provided thereon, wherein the control system is coupled to the magnetic sensing arrangement and the heating arrangement to operate the heating arrangement and to obtain a raw magnetic field measurement value from the magnetic sensing arrangement while the heating arrangement is deactivated. In one embodiment, the system further comprises a temperature sensing arrangement on the second substrate, wherein the control system is coupled to the temperature sensing arrangement to obtain a temperature measurement value concurrent to obtaining the raw magnetic field measurement value. In a further embodiment, the system further comprises a storage element on the second substrate to maintain a trim code for the magnetic sensing arrangement, wherein the control system is coupled to the storage element to determine a temperature compensation value based on the temperature measurement value and the trim code and adjust the raw magnetic field measurement value using the temperature compensation value to obtain a temperature compensated magnetic field measurement value. In another embodiment, the system further comprises an electronics substrate having a computing device provided thereon, wherein the control system is coupled to the computing device via the electronics substrate to receive an indication of a desire to heat the first substrate and activate the heating arrangement in response to the indication.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A sensing device comprising:
   a first sensing arrangement on a substrate semiconductor die to sense a first property;
   a heating arrangement to heat the first semiconductor die when activated;
   a temperature sensing arrangement;
   a control system coupled to the first sensing arrangement, the heating arrangement and the temperature sensing arrangement, the control system to activate the heating arrangement and automatically deactivate the heating arrangement in sync with obtaining a plurality of measurement values for the first property from the first sensing arrangement and a plurality of measured temperature values corresponding to a temperature of the first sensing arrangement from the temperature sensing arrangement concurrently to obtaining the plurality of measurement values for the first property.

2. The sensing device of claim 1, further comprising a storage element to maintain a trim code for the first sensing arrangement, wherein the control system is coupled to the storage element to determine a temperature compensation value based on the trim code and the plurality of measured temperature values and output a temperature compensated measurement value for the first property based on the temperature compensation value and the plurality of measurement values for the first property.

3. The sensing device of claim 1, further comprising a second die having the heating arrangement disposed thereon.

4. The sensing device of claim 3, wherein the control system is disposed on the second die.

5. The sensing device of claim 3, wherein the first die and the second die are encapsulated in a single device package.

6. The sensing device of claim 3, wherein the temperature sensing arrangement is disposed on the second die.

7. The sensing device of claim 3, wherein the first die and the second die are stacked.

8. The sensing device of claim 1, wherein the first sensing arrangement comprises a magnetic sensing arrangement configured to sense an ambient magnetic field.

9. A method of calibrating a sensing arrangement of a sensing device, the sensing arrangement being disposed on a semiconductor die, the sensing device including a temperature sensing arrangement, a heating arrangement, and a control system coupled to the sensing arrangement, the temperature sensing arrangement, and the heating arrangement, the method comprising:
   obtaining, by the control system from the sensing arrangement, a first measurement value for a first property sensed by the sensing arrangement that corresponds to a first temperature;
   obtaining, by the control system from the temperature sensing arrangement, a first temperature measurement value corresponding to the first temperature concurrently to obtaining the first measurement value;
   activating, by the control system, the heating arrangement to heat the semiconductor die after obtaining the first measurement value; and
   after activating the heating arrangement:
     obtaining, from the sensing arrangement, a second measurement value for the first property that corresponds to a second temperature;
     obtaining, from the temperature sensing arrangement, a second temperature measurement value corresponding to the second temperature concurrently to obtaining the second measurement value; and
     automatically deactivating, by the control system, the heating arrangement in sync with obtaining the second measurement value.

10. The method of claim 9, further comprising:
   obtaining, from the sensing arrangement after obtaining the second measurement value, a third measurement value for the first property that corresponds to a third temperature;
   determining a temperature compensation value based on the third temperature and a trim code for the sensing arrangement, wherein the trim code is determined based at least in part on the first measurement value, the first temperature measurement value, the second measurement value, and the second temperature measurement value; and
   adjusting the third measurement value by the temperature compensation value to obtain a temperature compensated measurement value for the first property.

11. The method of claim 9, wherein automatically deactivating the heating arrangement in sync with obtaining the second measurement value comprises deactivating the heating arrangement concurrently to operating a sampling arrangement coupled to an output of the sensing arrangement to obtain the second measurement value.

12. The method of claim 9, wherein the heating arrangement is disposed on a second semiconductor die encapsulated with the semiconductor die in a device package.

13. The method of claim 12, further comprising mounting the device package to an electronics substrate prior to obtaining the first measurement value, wherein activating the heating arrangement comprises:
   receiving an indication from a computing device mounted to the electronics substrate; and
   activating the heating arrangement in response to receiving the indication.

14. The method of claim 13, wherein automatically deactivating the heating arrangement in sync with obtaining the second measurement value comprises deactivating the heating arrangement while the indication is asserted.

15. The method of claim 13, further comprising:
   storing a trim code determined based at least in part on the first measurement value, the first temperature measurement value, the second measurement value, and the second temperature measurement value;
   obtaining, from the sensing arrangement after obtaining the second measurement value, a third measurement value for the first property;
   obtaining, from the temperature sensing arrangement, a third temperature measurement value;
   determining a temperature compensation value based on the third temperature measurement value and the trim code;
   adjusting the third measurement value by the temperature compensation value to obtain a temperature compensated measurement value for the first property; and
   providing the temperature compensated measurement value to the computing device.

16. A system comprising:
   a first semiconductor die having a magnetic sensing arrangement provided thereon; and
   a second semiconductor die including:
     a heating arrangement configured to heat the first semiconductor die; and a control system provided thereon, wherein the control system is coupled to the magnetic sensing arrangement and the heating arrangement to activate the heating arrangement and automatically deactivate the heating arrangement in sync with obtaining a plurality of raw magnetic field measurement values from the magnetic sensing arrangement and a plurality of temperature measurement values corresponding to a temperature of the magnetic sensing arrangement from a temperature sensing arrangement concurrently to obtaining the plurality of raw magnetic field measurement values.

17. The system of claim 16, wherein the temperature sensing arrangement is disposed on the second semiconductor die.

18. The system of claim 17, further comprising a storage element on the second semiconductor die to maintain a trim code for the magnetic sensing arrangement, wherein the control system is coupled to the storage element to determine a temperature compensation value based on the plurality of temperature measurement values and the trim code and adjust a raw magnetic field measurement value from the magnetic sensing arrangement using the temperature compensation value to obtain a temperature compensated magnetic field measurement value.

19. The system of claim 16, further comprising an electronics substrate having a computing device provided thereon, wherein the control system is coupled to the computing device via the electronics substrate to receive an indication of a desire to heat the first semiconductor die and activate the heating arrangement in response to the indication.

\* \* \* \* \*